(12) United States Patent
Kang et al.

(10) Patent No.: US 11,095,271 B2
(45) Date of Patent: Aug. 17, 2021

(54) EQUALIZER AND TRANSMITTER INCLUDING THE SAME

(71) Applicant: SAMSUNG ELECTRONICS CO., LTD., Suwon-si (KR)

(72) Inventors: Gun-Il Kang, Hwaseong-si (KR); June-Hee Lee, Seongnam-si (KR); Byung-Wook Cho, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 337 days.

(21) Appl. No.: 16/224,850

(22) Filed: Dec. 19, 2018

(65) Prior Publication Data

US 2019/0379357 A1   Dec. 12, 2019

(30) Foreign Application Priority Data

Jun. 11, 2018 (KR) .................. 10-2018-0067061

(51) Int. Cl.
*H03H 17/06* (2006.01)
*H03H 17/02* (2006.01)
*H04L 27/01* (2006.01)

(52) U.S. Cl.
CPC ........ *H03H 17/06* (2013.01); *H03H 17/0226* (2013.01); *H03H 17/0227* (2013.01); *H04L 27/01* (2013.01)

(58) Field of Classification Search
CPC ............... H03H 17/06; H03H 17/0227; H03H 17/0226; H03H 17/0607; H04L 27/01; H04L 25/03343; H04L 25/03019; H04L 25/0278; H03M 3/324; H04B 1/04
See application file for complete search history.

(56) References Cited

U.S. PATENT DOCUMENTS

| | | | |
|---|---|---|---|
| 6,850,579 B2 | 2/2005 | Lim et al. | |
| 6,888,904 B2 | 5/2005 | Lim et al. | |
| 7,386,044 B2 | 6/2008 | Yousef | |
| 7,664,808 B2 | 2/2010 | Jiang et al. | |
| 8,428,111 B2* | 4/2013 | Valliappan | H04B 3/143 375/232 |
| 8,472,513 B2 | 6/2013 | Malipatil et al. | |
| 8,976,896 B2 | 3/2015 | McCallister et al. | |
| 9,124,454 B1* | 9/2015 | Venkataraman | H04L 25/03343 |
| 9,178,617 B2 | 11/2015 | Kikuchi | |
| 10,250,417 B1* | 4/2019 | Sun | H04L 25/03885 |
| 2002/0067765 A1 | 6/2002 | Lim et al. | |
| 2007/0147491 A1* | 6/2007 | Casper | H04L 25/03885 375/232 |

(Continued)

*Primary Examiner* — Dac V Ha
(74) *Attorney, Agent, or Firm* — Volentine, Whitt & Francos, PLLC

(57) ABSTRACT

An integrated circuit for generating an equalized signal, according to a channel, from serial data includes a shift register that extracts a symbol sequence from the serial data. A data storage stores values of an equalized digital signal corresponding to potential symbol sequences corresponding to a filter coefficient sequence. A lookup table outputs the equalized digital signal of a value corresponding to the extracted symbol sequence. A digital-to-analog converter (DAC) converts the equalized digital signal into the equalized signal. A controller refreshes the lookup table, based on at least one of values stored in the data storage and values included in the lookup table, in response to a control signal.

17 Claims, 12 Drawing Sheets

(56) References Cited

U.S. PATENT DOCUMENTS

| | | | |
|---|---|---|---|
| 2013/0051436 A1* | 2/2013 | O'Keeffe | H04L 25/08 |
| | | | 375/219 |
| 2014/0029651 A1* | 1/2014 | Zhong | H04B 17/309 |
| | | | 375/219 |
| 2017/0214468 A1 | 7/2017 | Agazzi et al. | |

* cited by examiner

FIG. 8

| Coefficient | Symbol | Step Size | |
|---|---|---|---|
| C1 | 00 | X10 | ⎫ |
| | 01 | X11 | ⎬ 151_1 |
| | 10 | X12 | ⎬ |
| | 11 | X13 | ⎭ |
| C2 | 00 | X20 | ⎫ |
| | 01 | X21 | ⎬ 152_1 |
| | 10 | X22 | ⎬ |
| | 11 | X23 | ⎭ |
| C3 | 00 | X30 | ⎫ |
| | 01 | X31 | ⎬ 153_1 |
| | 10 | X32 | ⎬ |
| | 11 | X33 | ⎭ |
| C4 | 00 | X40 | ⎫ |
| | 01 | X41 | ⎬ 154_1 |
| | 10 | X42 | ⎬ |
| | 11 | X43 | ⎭ |

EQUALIZER AND TRANSMITTER INCLUDING THE SAME

CROSS-REFERENCE TO RELATED APPLICATION

This application claims the benefit of Korean Patent Application No. 10-2018-0067061, filed on Jun. 11, 2018, in the Korean Intellectual Property Office, the disclosure of which is incorporated herein in its entirety by reference.

BACKGROUND

The disclosure relates to an equalizer, and more particularly, to an equalizer including a lookup table and a transmitter including the equalizer.

In serial communication, an interconnection between a transmitter and a receiver, i.e., a channel, may distort signals. In order to compensate for distortion of signals generated in the channel, the transmitter and/or the receiver may include an equalizer. For example, the equalizer included in the transmitter may include a Finite Impulse Response (FIR) filter that provides an inverse transfer function of the transfer function of the channel. An equalizer including a high complexity filter may be necessary in order to precisely compensate for signal distortion while performing fast signal filtering for high speed serial communication. Further, in order to reduce power consumption and heat generation, an equalizer capable of reducing power consumption may be necessary.

SUMMARY

The disclosure provides an equalizer that provides high efficiency by using a refreshable lookup table, and a transmitter including the equalizer.

According to an aspect of the disclosure, there is provided an integrated circuit for generating an equalized signal from serial data according to a channel. The circuit includes a shift register configured to extract a symbol sequence from the serial data. A data storage stores values of an equalized digital signal corresponding to possible values of a symbol sequence corresponding to a filter coefficient sequence. A lookup table outputs the equalized digital signal of a value corresponding to the extracted symbol sequence. A digital-to-analog converter (DAC) converts the equalized digital signal into the equalized signal. A controller refreshes the lookup table, based on at least one of values stored in the data storage and values included in the lookup table, in response to a control signal.

According to another aspect of the disclosure, there is provided a transmitter for transmitting input data through a channel. The transmitter includes a serializer configured to generate serial data from the input data. An equalizer includes a finite impulse response (FIR) filter block that uses a lookup table that outputs a digital signal corresponding to a symbol sequence extracted from the serial data. A digital-to-analog converter outputs an equalized signal by converting the digital signal. A driver amplifies the equalized signal. The FIR filter block refreshes the lookup table based on channel information received through the channel.

According to another aspect of the disclosure, there is provided a method for transmitting serial data through a channel. The method includes: (1) receiving a control signal generated based on channel information received through the channel; (2) refreshing a lookup table configured to output an equalized digital signal from a symbol sequence in response to a control signal; (3) extracting a symbol sequence from the serial data; (4) providing the extracted symbol sequence to the lookup table; and (5) converting the digital signal outputted from the lookup table into an analog signal.

According to another aspect of the disclosure, there is provided an equalizer having a shift register, a digital equalizer circuit, and a digital to analog converter. The shift register extracts a sequence of symbols from serial data. The digital equalizer circuit generates a digital signal, corresponding to the sequence of symbols, that is equalized to compensate for a characteristic of a communication channel. The digital to analog converter converts the digital signal into an analog signal.

According to another aspect of the disclosure, there is provided a method of signal equalization. The method includes: (1) extracting, with a shift register, a sequence of symbols from serial data; (2) generating, with a digital equalizer circuit, a digital signal that: (a) corresponds to the sequence of symbols and (b) is equalized to compensate for a characteristic of a communication channel; and (3) converting, with a digital to analog converter, the digital signal into an analog signal.

BRIEF DESCRIPTION OF THE DRAWINGS

Embodiments of the disclosure will be more clearly understood from the following detailed description taken in conjunction with the accompanying drawings in which:

FIG. 8 is a diagram illustrating an example of a step size table according to an exemplary embodiment of the disclosure;

DETAILED DESCRIPTION OF THE EMBODIMENTS

Figure 1:
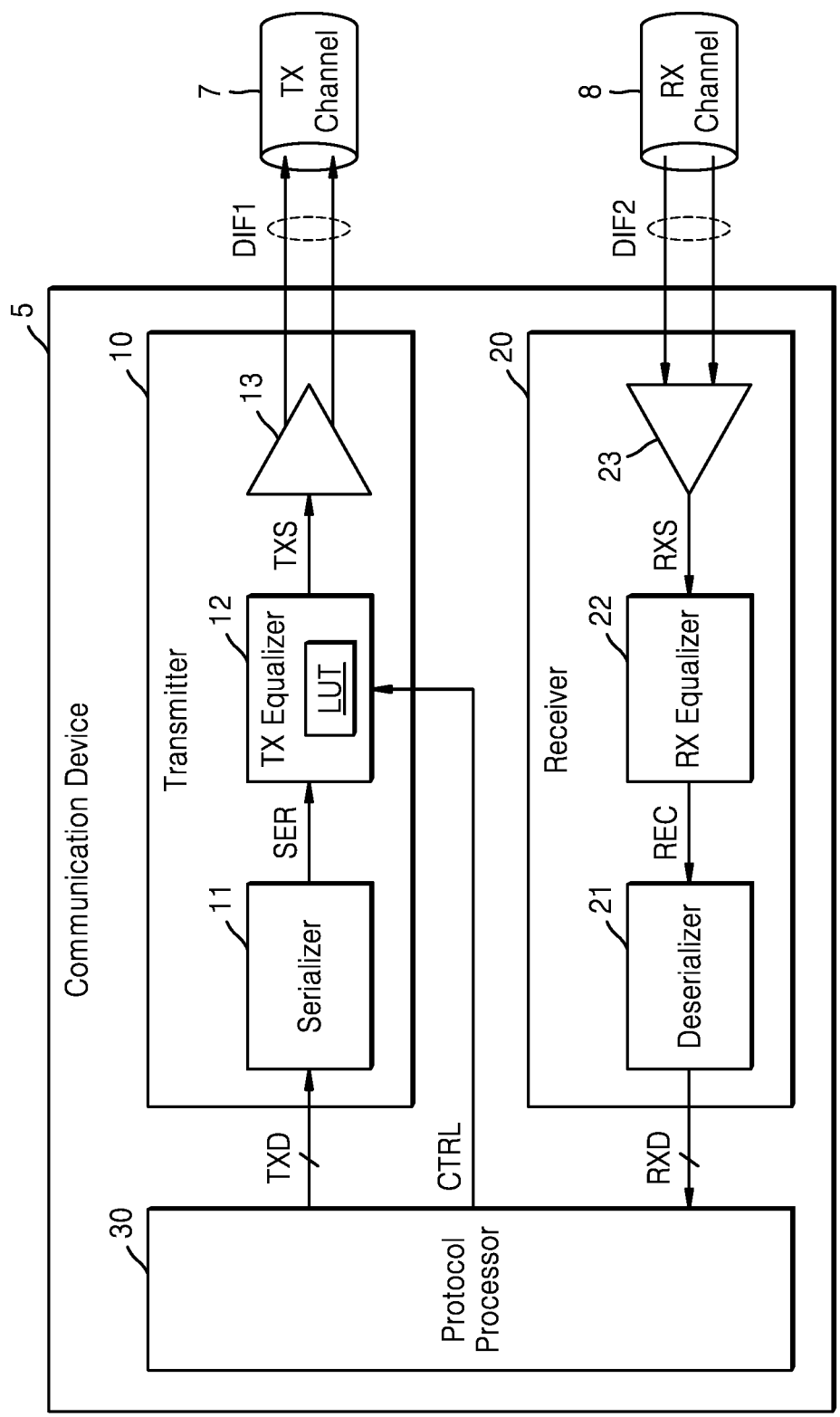
FIG. 1 is a block diagram illustrating a communication device according to an exemplary embodiment of the disclosure.

FIG. 1 is a block diagram illustrating a communication device 5 according to an exemplary embodiment of the disclosure. As shown in FIG. 1, the communication device 5 is capable of serial communication with a counterpart communication device via a TX channel 7 and an RX channel 8. Although FIG. 1 illustrates that the communication device 5 communicates with the counterpart communication device through a full duplex communication scheme, i.e., two channels (the TX and RX channels 7 and 8), according to some embodiments, the communication device 5 may communicate with the counterpart communication device through a half duplex communication scheme, i.e., one channel.

The TX channel 7 or the RX channel 8 may refer to interconnection between the communication device 5 and the counterpart communication device, and serial data signals DIF1 and DIF2 may transfer through the TX channel 7 and the RX channel 8, respectively. For example, the TX channel 7 or the RX channel 8 may include at least one of a conductive line of an integrated circuit, a pattern of a printed circuit board (PCB), a connector, and a cable. The serial data signals DIF1 and DIF2, which respectively pass through the TX channel 7 and the RX channel 8, may be differential signals as shown in FIG. 1 in some embodiments, or may be single signals unlike what is illustrated in FIG. 1.

The communication device 5 may refer to any device in serial communication with the counterpart communication device via the TX channel 7 and the RX channel 8. In some embodiments, the communication device 5 may be a die included in a semiconductor package and may be in serial communication with a counterpart communication device included in the same semiconductor package. In some embodiments, the communication device 5 may be a semiconductor package mounted on a PCB and may be in serial communication with the counterpart communication device mounted on the same PCB or mounted on another PCB. In some embodiments, the communication device 5 may be a system (e.g., a storage, a computing system, etc.) including at least one semiconductor package and a PCB and may be in serial communication with other systems. As shown in FIG. 1, the communication device 5 may include a transmitter 10, a receiver 20, and a protocol processor 30. In some embodiments, the transmitter 10 and the receiver 20 may be implemented as one block as a transceiver. The transmitter 10, the receiver 20, and the protocol processor 30 may provide a physical layer of communication and may be collectively referred to as a SerDes (serializer/deserializer) for serial communication.

The protocol processor 30 may provide the transmitter 10 with TX data TXD as data to be transmitted through the TX channel 7 and may receive, from the receiver 20, RX data RXD as data received through the RX channel 8. The TX data TXD and the RX data RXD may transfer through a plurality of signal lines, i.e., a data bus. The protocol processor 30 may generate TX data TXD or process RX data RXD according to protocols stipulated in protocols such as the Optical Internetworking Forum (01F), Institute of Electrical and Electronics Engineers (IEEE), and the like. For example, the protocol processor 30 may generate TX data TXD by processing source data received from other components included in the communication device 5 or outside the communication device 5. In addition, the protocol processor 30 may provide result data, which is generated by processing the RX data RXD, to the other components included in the communication device 5 or outside the communication device 5. The protocol processor 30 may include at least one of a hardware block designed through logic synthesis and a software block including a series of instructions. In the present specification, the TX data TXD provided to the transmitter 10 may be referred to as input data.

The protocol processor 30 may extract information about the TX channel 7, that is, channel information, from the RX data RXD, and generate a control signal CTRL based on the channel information. For example, the counterpart communication device communicating with the communication device 5 through the TX channel 7 may provide the communication device 5 with channel information as information for adjusting the equalizing operation of the transmitter 10 based on the characteristics of the TX channel 7. The protocol processor 30 may generate the control signal CTRL based on the channel information, and a TX equalizer 12 of the transmitter 10 may receive the control signal CTRL as described below.

The transmitter 10 may receive the TX data TXD and the control signal CTRL from the protocol processor 30 and may output the serial data signal DIF1 to the TX channel 7. As shown in FIG. 1, the transmitter 10 may include a serializer 11, the TX equalizer 12, and a driver 13. In some embodiments, the transmitter 10 may be included in an integrated circuit fabricated through a semiconductor process.

The serializer 11 may convert TX data TXD received via a data bus to serial data SER. For example, the serial data SER may include a series of symbols each having a unit interval (UI) of "1/baud rate", and the serializer 11 may latch n-bit TX data TXD as "baud rate/n" when n is an integer greater than 1.

The TX equalizer 12 may receive the serial data SER from the serializer 11 and may generate the TX signal TXS. The TX equalizer 12 may perform equalization to compensate for distortion of the serial data signal DIF1 generated in the TX channel 7, e.g., Inter-Symbol Interference (ISI). In some embodiments, the TX equalizer 12 may include a Finite Impulse Response (FIR) filter, as described below with reference to FIG. 2, and the FIR filter may generate a TX signal TXS by operating a symbol sequence extracted from serial data SER with a filter coefficient sequence. In high-speed serial communication such as 56 Gbps, the distortion of the serial data signal DIF1 may be intensified, and thus the TX equalizer 12 may be required to perform sophisticated equalization. As described below, the TX equalizer 12 may implement by an FIR filter that provides high efficiency by using a lookup table LUT.

The TX equalizer 12 may include a lookup table LUT that stores values of the TX signal TXS corresponding to possible values of the symbol sequence, and the lookup table LUT may output a TX signal TXS having a value corresponding to the symbol sequence. As such, the multiplications required in the FIR filter may be omitted, and a plurality of multipliers and adders may be omitted from the TX equalizer 12. For example, when serial data SER is converted into analog signals to implement a FIR filter and the analog signals are processed by using an amplifier or the like, equalization of the serial data SER may require high power consumption and complexity and may have low accuracy due to process, voltage, and temperature (PVT) variations. In some embodiments, as illustrated in FIG. 1, the TX equalizer 12 may implement a digital FIR filter having a simple structure by using a refreshable lookup table LUT and may have high extendibility and improved robustness to PVT variation. Further, as will be described later, the TX equalizer 12 may perform clock gating of the blocks necessary for refreshing the lookup table LUT, and thus, may perform equalization of the serial data SER by using low power.

The lookup table LUT included in the TX equalizer 12 may be refreshable, and the TX equalizer 12 may refresh the lookup table LUT based on the control signal CTRL received from the protocol processor 30. For example, as described later with reference to FIG. 3, the TX equalizer 12 may select one of a plurality of filter coefficient sequences based on the control signal CTRL and may load a data set corresponding to the selected filter coefficient sequence to the lookup table LUT. Further, as will be described later with reference to FIG. 6 and the like, the TX equalizer 12 may extract the variation of the filter coefficient from the control signal CTRL and may refresh the lookup table LUT by adding the offset according to the variation of the filter coefficient. As such, the TX equalizer 12 may efficiently support protocols that define programmable equalization by using the refreshable lookup table LUT. In the present specification, the TX equalizer 12 may be referred to as an equalizer, and exemplary embodiments of the disclosure will be described primarily with reference to the TX equalizer 12. However, it will be understood that the exemplary embodiments of the disclosure may also be applied to an equalizer which is different from the TX equalizer 12, such as an RX equalizer 22 of the receiver 20.

The driver 13 may generate the serial data signal DIF1 by amplifying the TX signal TXS and may output the serial data signal DIF1 to the TX channel 7. In some embodiments, the driver 13 may generate a serial data signal DIF1 having a voltage level that is changed according to the TX signal TXS and may generate a serial data signal DIF1 having an intensity of light that is changed according to the TX signal TXS. In the example of FIG. 1, the driver 13 may be referred to as a differential driver.

The receiver 20 may receive the serial data signal DIF2 through the RX channel 8 and may provide the RX data RXD to the protocol processor 30. As shown in FIG. 1, the receiver 20 may include a differential receiver 23, an RX equalizer 22, and a deserializer 21. In some embodiments, the receiver 20 may be included in an integrated circuit fabricated through a semiconductor process.

The differential receiver 23 may generate the RX signal RXS by amplifying the serial data signal DIF2, which is a differential signal. In addition, the differential receiver 23 may have an input impedance for impedance matching.

The RX equalizer 22 may receive the RX signal RXS from the differential receiver 23 and may generate an equalized signal REC. The RX equalizer 22 may perform equalization to compensate for distortion of the serial data signal DIF2 generated in the RX channel 8. For example, similarly to the TX equalizer 12, the RX equalizer 22 may also implement an FIR filter using a refreshable lookup table. Although not shown in FIG. 1, the receiver 20 may further include a clock and data recovery CDR circuit together with the RX equalizer 22. The clock and data recovery CDR circuit may monitor the transitions of signals and may recover a clock signal and data.

The deserializer 21 may convert the equalized signal REC received from the RX equalizer 22 into RX data RXD. For example, the equalized signal REC may include a series of symbols each having a UI of "1/baud rate", and the deserializer 21 may output n-bit RX data RXD as the frequency of "baud rate/n" when n is an integer greater than 1.

Figure 2:
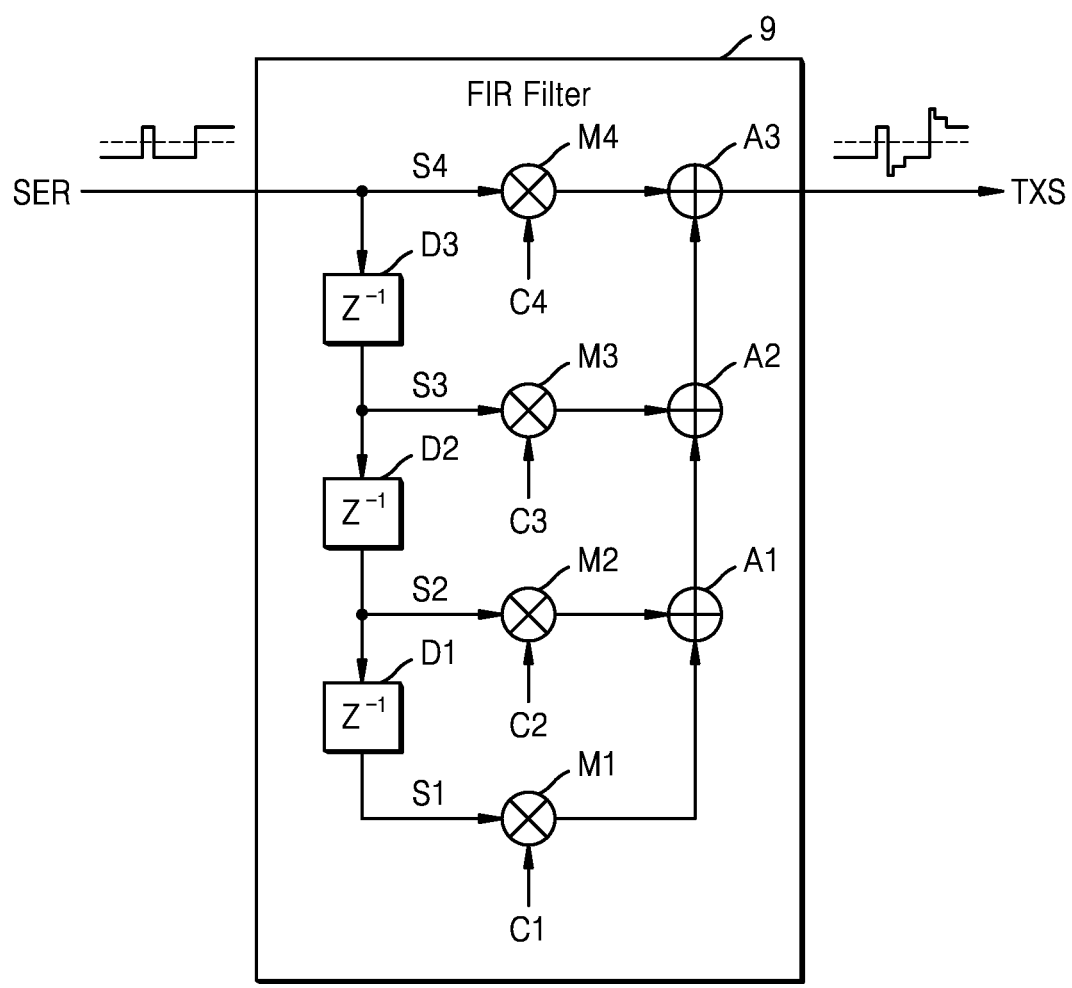
FIG. 2 is a block diagram schematically illustrating a related-art FIR filter.

FIG. 2 is a block diagram showing an example of a related-art FIR filter 9. Specifically, FIG. 2 schematically illustrates the operation of the FIR filter 9 for generating the TX signal TXS from the serial data SER, and in the example of FIG. 2, the FIR filter 9 may operate as a 4-tap feed forward equalizer (FFE). The number and type of taps of the FIR filter 9 of the present application are not limited to this.

The FIR filter 9 may calculate the symbol sequence in the serial data SER and a filter coefficient sequence including the filter coefficients of the FIR filter 9. For example, as shown in FIG. 2, the symbol sequence may include four symbols S1, S2, S3, and S4 corresponding to four filter coefficients C1, C2, C3, and C4 of the filter coefficient sequence, respectively. The four symbols S1, S2, S3, and S4 may be multiplied with the four filter coefficients C1, C2, C3, and C4, respectively, and the multiplication results may be summed. Namely, a result value Y according to a symbol sequence and a filter coefficient sequence may be calculated as shown in Equation 1 below.

$$Y = S1 \cdot C1 + S2 \cdot C2 + S3 \cdot C3 + S4 \cdot C4 \qquad \text{[Equation 1]}$$

As such, as illustrated in FIG. 2, the serial data SER including symbols corresponding to the predetermined levels may be equalized as the TX signal TXS including a waveform modified according to the characteristics of the TX channel 7.

Undesirable problems may arise when multiplication and addition of symbols and filter coefficients to implement the FIR filter 9 are performed by an analog multiplier and an analog adder. For example, the fourth symbol S4, and the first, second, and third symbols S1, S2 and S3 outputted from the delay units D1, D2, and D3 may be respectively converted into analog signals, and the four filter coefficients C1, C2, C3, and C4 may also be converted into analog signals, respectively. Each of four multiplications M1, M2, M3, and M4 may be implemented as an analog multiplier including an amplifier, and each of three additions A1, A2, and A3 may also be implemented as an analog adder. As such, the power consumption by the FIR filter 9 may be significantly high due to power consumption by the analog multipliers and adders, and particularly as the number of taps of the FIR filter 9 increases, the power consumption and the complexity of the FIR filter 9 may be significantly increased.

On the other hand, as described later with reference to the drawings, as the TX equalizer 12 of FIG. 1 uses the lookup table LUT, the multiplications of the FIR filter 9 (e.g., M1, M2, M3, and M4) may be omitted, and a high extendibility according to the increased number of taps in the FIR filter 9 may be provided. In addition, the TX equalizer 12 of FIG. 1 may be used in a protocol that defines programmable equalization by supporting the refreshment of the lookup table LUT.

Figure 3:
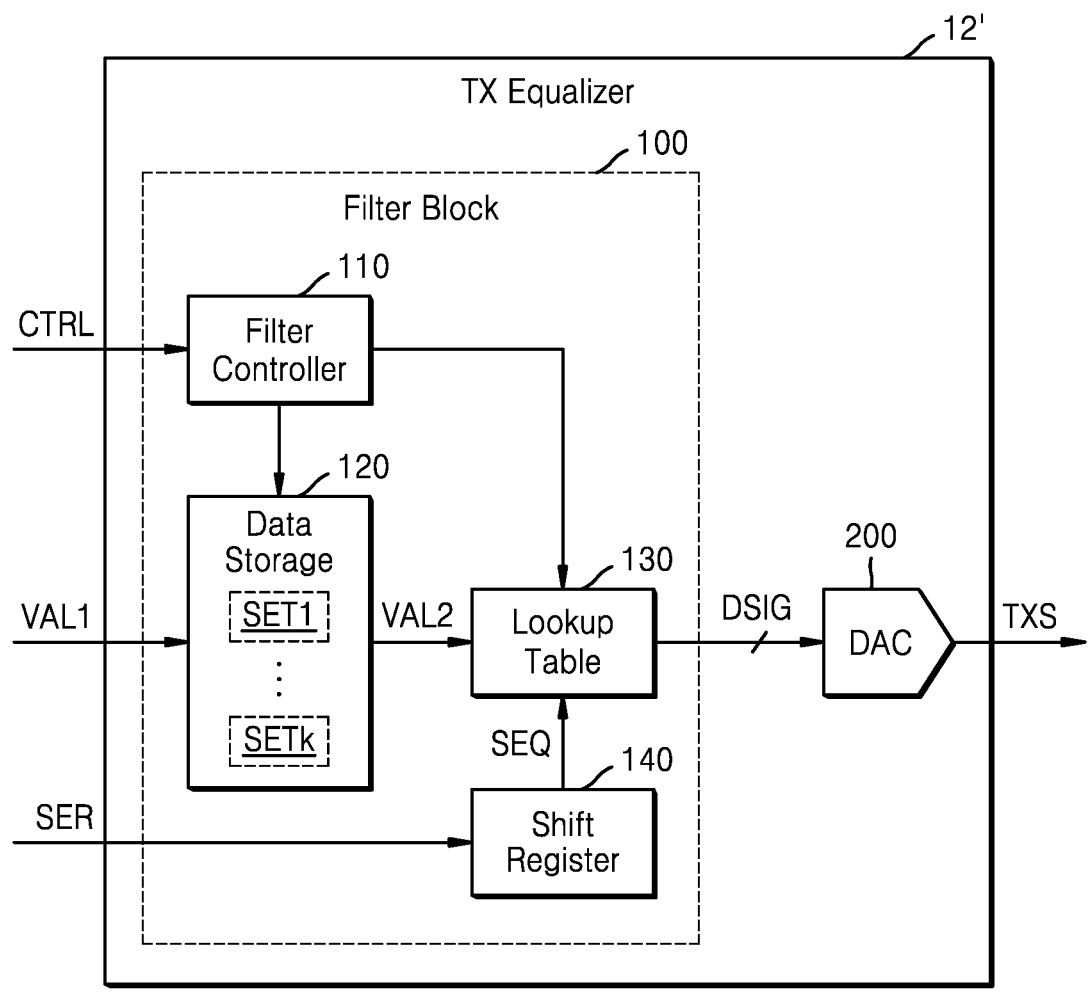
FIG. 3 is a block diagram illustrating a TX equalizer according to an exemplary embodiment of the disclosure.

FIG. 3 is a block diagram illustrating a TX equalizer 12' according to an exemplary embodiment of the disclosure. As described above with reference to FIG. 1, the TX equalizer 12' of FIG. 3 may receive the serial data SER and the control signal CTRL, output the TX signal TXS, and may include a lookup table 130. Hereinafter, FIG. 3 will be described with reference to FIG. 1.

Referring to FIG. 3, the TX equalizer 12' may include a filter block 100 and a digital-to-analog converter (DAC) 200. The filter block 100 may generate a computed signal, i.e., a digital signal DSIG, from the filter coefficient sequence and the symbol sequence extracted from the serial data SER, as described above with reference to FIG. 2, and the DAC 200 may convert the digital signal DSIG into a TX signal TXS, which is an analog signal. The filter block 100 may include a controller 110, a data storage 120, the lookup table 130, and a shift register 140, as shown in FIG. 3.

The shift register 140 may receive the serial data SER and may extract the symbol sequence SEQ from the serial data SER. An example of the operation of the shift register 140 will be described later with reference to FIG. 4.

The data storage 120 may store values of the digital signal DSIG corresponding to possible values of the symbol sequence SEQ. The data storage 120 may have any structure for storing the values of the digital signal DSIG. The data storage 120 may include volatile memories, such as Dynamic Random Access Memory (DRAM), Static Random Access Memory (SRAM), and the like in some embodiments, and may include nonvolatile memories such as Electrically Erasable Programmable Read-Only Memory (EEPROM), a flash memory, Phase Change Random Access Memory (PRAM), Resistance Random Access Memory (RRAM), a Nano Floating Gate Memory (NFGM), Polymer Random Access Memory (PoRAM), Magnetic Random Access Memory (MRAM), Ferroelectric Random Access Memory (FRAM), and the like in some embodiments. The data storage 120 may also include a plurality of registers and may be referred to as a register set. An example of the values stored in the data storage 120 will be described later with reference to FIG. 5.

In some embodiments, the values stored in the data storage 120 may be refreshed. For example, the data storage 120 may be rewritable. As illustrated in FIG. 3, the data storage 120 may receive a first value VAL1 from outside the TX equalizer 12' (e.g., the protocol processor 30 of FIG. 1), and as the first value VAL1 is stored in the data storage 120, the previously stored values may be changed. For example, the protocol processor 30 may store values of the digital signal DISG by providing the first value VAL1 to the data storage 120 when the operation of the communication device 5 starts. In addition, the protocol processor 30 may generate the first value VAL1 based on the RX data RXD.

In some embodiments, the data storage 120 may store values of the digital signal DSIG grouped into a plurality of sets of data corresponding to a plurality of filter coefficient sequences. For example, as shown in FIG. 3, the data storage 120 may store a first to a k-th data sets SET1 to SETk when k is an integer greater than 1, and the first to the k-th data sets SET1 to SETk may store the same or different values of the digital signal DSIG for the same symbol sequence, respectively. For example, the protocol may predefine k filter coefficient sequences and define a process by which a transmitting side and a receiving side select one of the k filter coefficient sequences. The data storage 120 may store first to k-th data sets SET1 to SETk corresponding to the k filter coefficient sequences, respectively.

The lookup table 130 may output digital signals DSIG having a value corresponding to the symbol sequence SEQ. The lookup table 130 may include values of the digital signals DSIG, corresponding to possible values of the symbol sequence SEQ, for example, values corresponding to one of the first to k-th data sets SET1 to SETk. For example, when 7-bit digital signals DSIG are provided to the DAC 200, and the symbol sequence SEQ includes 4 symbols as 2-bit symbols according to 4-level pulse amplitude modulation (PAM4), one data set may include 256 pieces of data composed of 7 bits. In some embodiments, the lookup table 130 may be implemented as a memory that includes a cell array and receives the symbol sequence SEQ as an address. In some embodiments, the lookup table 130 may include a plurality of registers and may include a multiplexer which outputs values stored in at least some of the plurality of registers as digital signals DISG according to the symbol sequence SEQ.

The controller 110 may receive the control signal CTRL and may control the data storage 120 and the lookup table 130. The controller 110 may refresh the lookup table 130 by loading at least some of the values stored in the data storage 120 to the lookup table 130 in response to the control signal CTRL. For example, the protocol processor 30 may provide the TX equalizer 12' with a control signal CTRL including information indicating one of the k filter coefficient sequences based on the RX data RXD. In response to the control signal CTRL, the controller 110 may control the data storage 120 to output the values included in one of the first to k-th data sets SET1 to SETk corresponding to the k filter coefficient sequences, respectively, as a second value VAL2 and may control the lookup table 130 to store the second value VAL2 in the lookup table 130.

Figures 4, 5:
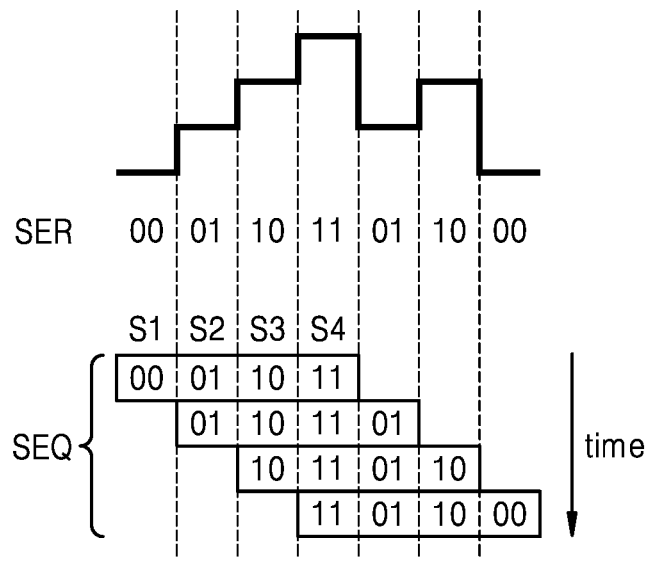
FIG. 4 is a flowchart illustrating an example of serial data and symbol sequences according to an exemplary embodiment of the disclosure.
FIG. 5 is a diagram illustrating an example of a lookup table according to an exemplary embodiment of the disclosure.

FIG. 4 is a flowchart illustrating an example of serial data SER and a symbol sequence SEQ according to an exemplary embodiment of the disclosure. As shown in FIG. 4, the serial data SER and the symbol sequence SEQ may include 2-bit symbols corresponding to 4 levels of PAM4. Hereinafter, FIG. 4 will be described with reference to FIG. 1 and FIG. 3.

Referring to FIG. 4, the serial data SER may include a series of symbols. A symbol may have a value of one of "00", "01", "10", and "11", and the values of the symbols may correspond to four different levels, respectively. The symbol sequence SEQ may include four consecutive symbols contained in the serial data SER. As shown in FIG. 4, the shift register 140 of FIG. 3 may sequentially extract the symbol sequence SEQ from the serial data SER and the symbol sequence SEQ may be provided to the lookup table 130. Hereinafter, exemplary embodiments of the disclosure will be described with reference to the serial data SER and the symbol sequence SEQ including 2-bit symbols, as shown in FIG. 4, but the exemplary embodiments of the disclosure may also be applied to the serial data SER and the symbol sequence SEQ including 1-bit symbols corresponding to two levels of non-return-to-zero (NRZ).

FIG. 5 is a diagram illustrating an example of a lookup table 130 according to an exemplary embodiment of the disclosure. Specifically, FIG. 5 shows a lookup table LUT' containing values of the digital signals DSIG corresponding to the symbol sequence SEQ including four symbols S1, S2, S3, and S4 for PAM4.

Referring to FIG. 5, the lookup table LUT' may include 256 values (V1 to V256) of the digital signals DSIG. Each of the 256 values (V1 to V256) of the digital signals DSIG may be a value which has been previously calculated from the symbol sequence SEQ and the filter coefficient sequence and stored. For example, the value V1 of the digital signal DSIG may coincide with a result value Y which is calculated from the symbol sequence SEQ including 4 symbols S1, S2, S3, and S4 of "00", "00", "00" and "00", and the filter coefficient sequence including 4 filter coefficients C1, C2, C3, and C4, based on the FIR filter 9 of FIG. 2. Each of the 256 values (V1 to V256) of the digital signal DIG may have the same number of bits. As described above with reference to FIG. 3, one data set (e.g., SET1) stored in the data storage 120 may also include 256 values as shown in FIG. 5. It should be understood that the number of symbols in the above symbol sequence SEQ and the number of filter coefficients in the filter coefficient sequence are merely exemplary, and the application is not limited thereto.

Figure 6:
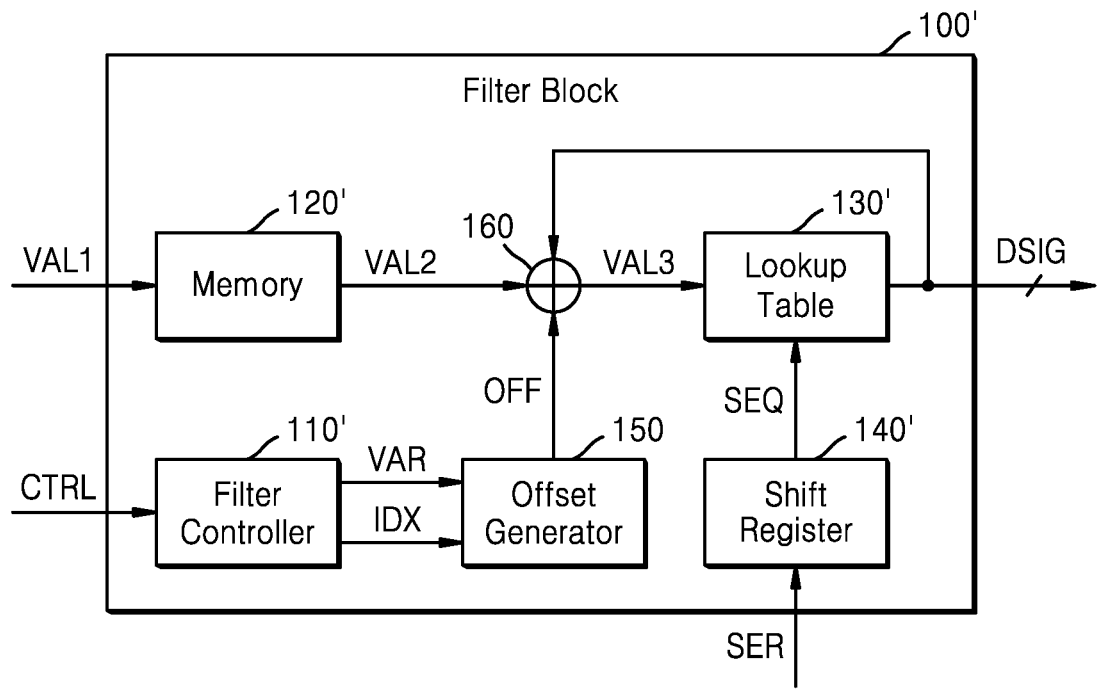
FIG. 6 is a block diagram illustrating an FIR filter according to an exemplary embodiment of the disclosure.

FIG. 6 is a block diagram illustrating a filter block 100' according to an exemplary embodiment of the disclosure. As shown in FIG. 6, the filter block 100' may include a controller 110', a data storage 120', a lookup table 130', and a shift register 140' and may further include an offset generator 150 and a calculator 160 as compared to the filter block 100 of FIG. 3. Hereinafter, descriptions that are the same as those given with reference to FIG. 3 will be omitted from the description of FIG. 6, and FIG. 6 will be described with reference to FIG. 1.

The controller 110' may refresh the lookup table 130' according to the variation of the filter coefficient based on the control signal CTRL. In some embodiments, the protocol may define the process in which the receiving side adjusts the filter coefficient of the FIR filter implemented in the equalizer of the transmitting side, and thus equalization more suitable for the TX channel 7 may be performed at the transmitting side. The protocol processor 30 may extract the information indicating the variation of the filter coefficient from the RX data RXD and may generate the control signal CTRL according to the extracted information. The controller 110' may provide the offset generator 150 with the variation signal VAR indicating the variation information of the filter and the index IDX of the filter coefficient based on the control signal CTRL. For example, the variation signal VAR may indicate at least one of up, down, hold, and reset of the filter coefficient and may include a variation amount of the filter coefficient. Further, the index IDX of the filter coefficient may have a value of one of 1 to 4 to indicate one of the four filter coefficients C1, C2, C3, and C4. Although not shown in FIG. 6, the controller 110' may further provide an additional signal (e.g., the SEL of FIG. 7) to the offset generator 150 and may generate signals for controlling the data storage 120' and the lookup table 130'.

The offset generator 150 may generate an offset OFF of the digital signal DISG corresponding to the variation of the filter coefficient. Referring to Equation 1, a variation generated in one filter coefficient may cause a variation of the result value Y. For example, when the first filter coefficient C1 increases, the variation of the result value Y may be determined by the value of the first symbol S1 and the increased amount of the first filter coefficient C1. Thus, the offset generator 150 may generate an offset corresponding to the amount of change in the result value Y according to the variation of the filter coefficient and may generate each of the offsets corresponding to the possible values (i.e., "00", "01", "10", and "11") of the symbol corresponding to the changed filter coefficient. Examples of the offset generator 150 will be described later with reference to FIGS. 7 and 8, etc.

The calculator 160 may perform addition or subtraction on at least two of the values stored in the data storage 120', the values stored in the lookup table 130' and the offset OFF according to the control of the controller 110'. For example, as described above with reference to FIG. 3, if the second value VAL2 provided from the data storage 120' is stored in the lookup table 130', the controller 110' may control the calculator 160 to output the third value VAL3 that is equal to the second value VAL2. In addition, in order to add the offset according to the variation of the filter coefficient, the calculator 160 may add the second value VAL2 provided from the data storage 120' and the offset OFF provided from the offset generator 150, or may add the digital signal DSIG provided from the lookup table 130' and the offset OFF in some embodiments. For example, as described above with reference to FIG. 3, in order to store the second value VAL2 initially provided from the data storage 120' in the lookup table 130', the calculator 160 may output a third value VAL3 that is equal to the second value VAL2 by passing the second value VAL2, or the offset generator 150 may output the offset OFF, which is 0, according to the control of the controller 110'. Thereafter, the offset generator 150 may generate an offset OFF based on the variation signal VAR and the index IDX, and the calculator 160 may output the third value VAL3 by adding the digital signal DSIG provided from the lookup table 130' and the offset OFF, or the third value VAL3 may be stored in the lookup table 130'.

Figure 7:
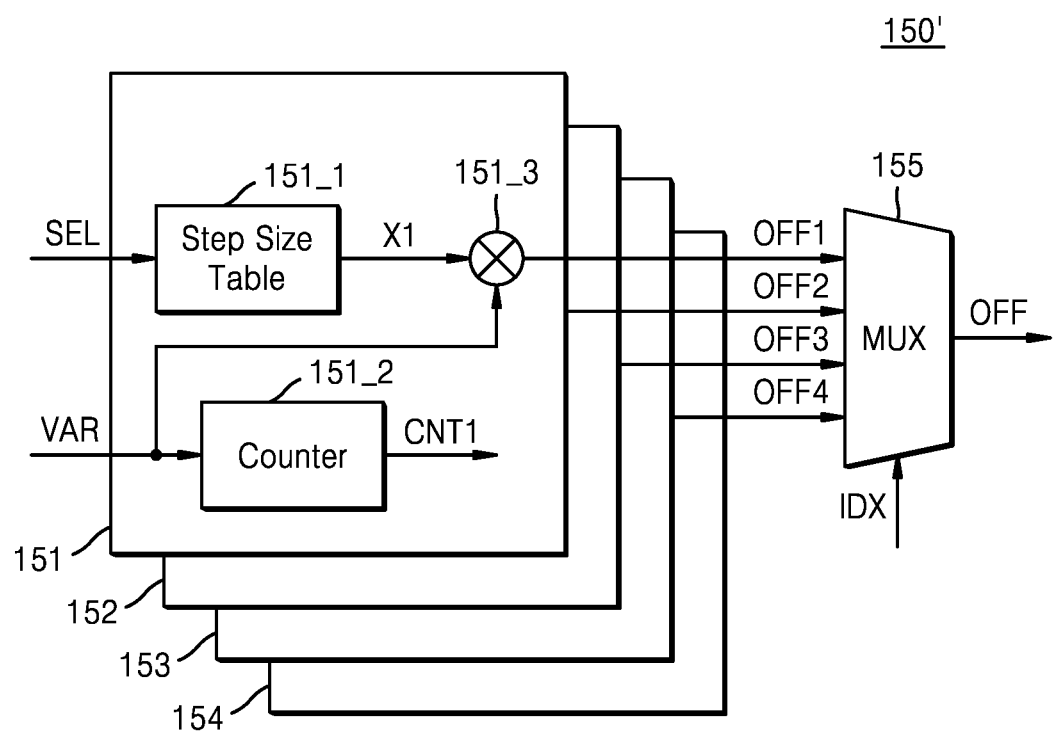
FIG. 7 is a block diagram illustrating an example of an offset generator of FIG. 6 according to an exemplary embodiment of the disclosure.

FIG. 7 is a block diagram illustrating an example of the offset generator 150 of FIG. 6 according to an exemplary embodiment of the disclosure, and FIG. 8 is a diagram illustrating an example of a step size table according to an exemplary embodiment of the disclosure. As described above with reference to FIG. 6, the offset generator 150' of FIG. 7 may receive the variation signal VAR and the index IDX of the filter coefficient and may generate an offset OFF. Hereinafter, FIGS. 7 and 8 will be described with reference to FIG. 6.

Referring to FIG. 7, the offset generator 150' may include four offset generators, for example, first, second, third, and fourth offset generators 151, 152, 153, and 154 corresponding to the four filter coefficients C1, C2, C3, and C4, respectively, and a multiplexer 155. The four offset generators, that is, the first, second, third, and fourth offset generators 151, 152, 153 and 154, may have the same structure and may include each of the step size tables including different values. The four offset generators, that is, the first, second, third, and fourth offset generators 151, 152, 153, and 154, may generate four offsets OFF1, OFF2, OFF3 and OFF4, respectively, and the multiplexer 155 may output one of the offsets OFF1, OFF2, OFF3 and OFF4 as an offset OFF.

The first offset generator 151 may include a first step size table 151_1, a counter 151_2, and a multiplier 151_3. The first step size table 151_1 may include step sizes corresponding to a plurality of pairs of filter coefficients and symbols and may output a step size X1 corresponding to a pair of a filter coefficient and a symbol. For example, referring to FIG. 8, the first step size table 151_1 may include step sizes X10 to X13 corresponding to the possible values of the symbols under the first filter coefficient C1. The first step size table 151_1 may output one of the step sizes X10 to X13 as the step size X1 according to the selection signal SEL received from the controller 110'. The selection signal SEL may represent one of four symbols "00", "01", "10", and "11". For example, the controller 110' may generate the selection signal SEL such that "00", "01", "10", and "11" are sequentially selected, and the first step size table 151_1 may sequentially output the step sizes corresponding to "00", "01", "10", and "11", that is, "X10", "X11", "X12", and "X13" of FIG. 8. Thus, the first offset generator 151 may sequentially provide four offsets corresponding to the possible values of the input symbol multiplied by the first filter coefficient C1 in the FIR filter. In some embodiments, two or more offsets corresponding to two or more symbols may be generated in parallel.

The counter 151_2 may generate a count value CNT1 that is increased, decreased, or maintained according to the variation signal VAR. For example, the counter 151_2 may output a count value CNT1 indicating 2 when it receives a variation signal VAR indicating "up" three times and a variation signal VAR indicating "down" once. Accordingly, when the variation signal VAR indicates the reset of the first filter coefficient C1, the count value CNT1 may be used to offset the offset added (or subtracted) until the present. An example of resetting the filter coefficient will be described later with reference to FIG. 13.

The multiplier 151_3 may output the first offset (OFF1) from the step size X1 based on the variation signal VAR. For example, when the step size X1 is a positive value, the multiplier 151_3 may output the step size X1 as the first offset (OFF1) in response to the variation signal VAR indicating "up" and may output the first offset OFF1 by changing the sign of the step size X1 in response to the variation signal VAR indicating "down". Thus, in some embodiments, the multiplier 151_3 may have a simple structure that provides a selective change of sign, instead of having a structure for multiplication.

Similar to the first offset generator 151, the second, third, and fourth offset generators 152, 153, and 154 may generate the second, third, and fourth offsets OFF2, OFF3, and OFF4 corresponding to the second, third, and fourth filter coefficients C2, C3, and C4, respectively. To this end, the second offset generator 152 may include a second step size table 152_1 of FIG. 8, the third offset generator 153 may include a third step size table 153_1 of FIG. 8, and the fourth offset generator 154 may include a fourth step size table 154_1 of FIG. 8.

Figure 9:
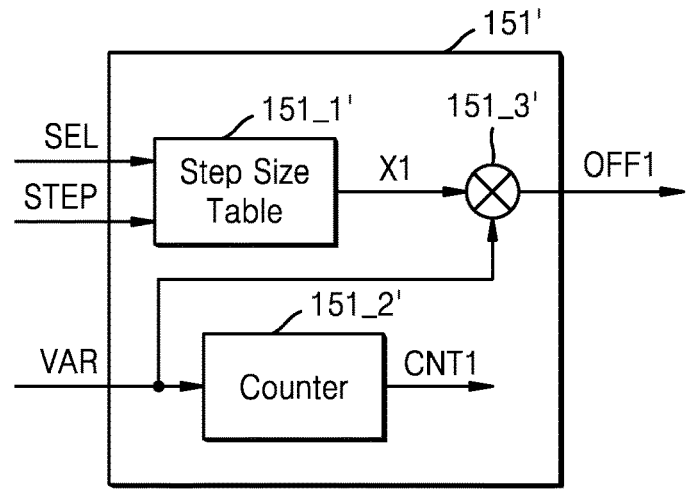
FIG. 9 is a diagram illustrating an example of the offset generator according to an exemplary embodiment of the disclosure.

FIG. 9 is a diagram illustrating an example of an offset generator according to an exemplary embodiment of the disclosure. Specifically, FIG. 9 shows a first offset generator 151' that generates a first offset OFF1 corresponding to a first filter coefficient C1.

Referring to FIG. 9, the first offset generator 151' may include a first step size table 151_1', a counter 151_2', and a multiplier 151_3'. Compared with the first offset generator 151 of FIG. 7, the first offset generator 151' of FIG. 9 may include the first step size table 151_1' which is refreshable. As shown in FIG. 9, the first step size table 151_1' may receive not only a selection signal SEL but also a step signal STEP. For example, the controller 110' of FIG. 6 may extract a new step size from the control signal CTRL and may generate the step signal STEP according to the new step size. The first step size table 151_1' may receive the step signal STEP, and as the step size corresponding to the step signal STEP is stored, the previously stored step sizes may be changed. For example, the protocol processor 30 of FIG. 1 may generate a control signal CTRL that includes a step size when the operation of the communication device 5 starts. Further, the protocol processor 30 may generate the control signal CTRL including the step size based on the RX data RXD.

Figure 10:
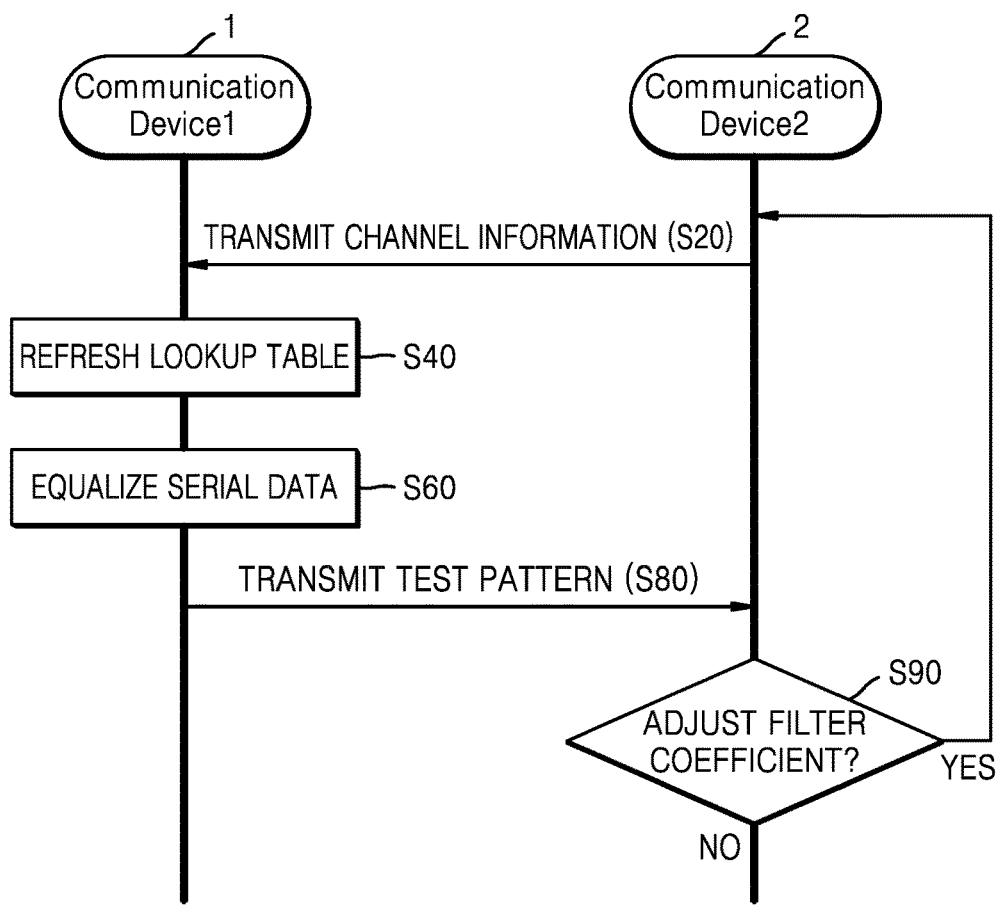
FIG. 10 is a diagram illustrating an equalization method over time according to an exemplary embodiment of the disclosure.

FIG. 10 is a diagram illustrating an equalization method over time according to an exemplary embodiment of the disclosure. For example, the equalization method of FIG. 10 may be performed by the first communication device 1 including the TX equalizer 12 of FIG. 1 and the second communication device 2 communicating with the first communication device 1. The filter coefficients for equalization may be determined according to the equalization method illustrated in FIG. 10, and the method for determining the filter coefficients may be referred to as training of filter coefficients. It is assumed below that the first communication device 1 of FIG. 10 includes the components of the communication device 5 of FIG. 1, and FIG. 10 will be described with reference to FIG. 1.

Referring to FIG. 10, in operation S20, the second communication device 2 may transmit channel information. For example, the second communication device 2 may first transmit, to the first communication device 1, channel information including information indicating one of the plurality of data sets, as described above with reference to FIG. 3.

In operation S40, the first communication device 1 may refresh the lookup table LUT. For example, the protocol processor 30 of the first communication device 1 may extract information indicating a data set from the channel information received in operation S20 and may transmit the control signal CTRL including the extracted information to the TX equalizer 12. TX equalizer 12 may refresh the lookup table LUT based on the control signal CTRL. The lookup table LUT may include values of the digital signal DSIG corresponding to possible values of the symbol sequence extracted from the serial data SER. An example of operation S40 of refreshing the lookup table LUT in response to channel information including information indicating a data set will be described with reference to FIG. 11.

In operation S60, the first communication device 1 may equalize the serial data SER. For example, in the TX equalizer 12 of the first communication device 1, the lookup table LUT may output a digital signal (e.g., DSIG in FIG. 3) corresponding to the symbol sequence of the serial data SER, and the DAC 200 included in the TX equalizer 12 may convert the digital signal into an analog signal. Accordingly, an adder and a multiplier for multiplication and addition between the symbol sequence and the filter coefficient sequence for implementing the FIR filter 9 of FIG. 2 may be omitted. The example of operation S60 will be described with reference to FIG. 14.

In operation S80, the first communication device 1 may transmit a test pattern. For example, the test pattern may include a pattern previously shared by the first communication device 1 and the second communication device 2, and the second communication device 2 may receive the test pattern through a channel (e.g., 7 of FIG. 1).

In operation S90, the second communication device 2 may determine whether to adjust the filter coefficient. For example, the second communication device 2 may evaluate the test pattern received from the first communication device 1 and determine whether to adjust at least one of the coefficients of the FIR filter used for equalization of the first communication device 1 according to the evaluation result. As illustrated in FIG. 10, when it is determined not to adjust at least one of the filter coefficients, the training of the filter coefficients may be terminated and the first communication device 1 may transmit the signal, which is equalized according to the current filter coefficients, to the second communication device 2. On the other hand, when it is determined to adjust at least one of the filter coefficients, operation S20 may be performed.

Unlike the initially performed operation S20, in operation S20, which is performed after operation S90, the second communication device 2 may transmit channel information, which includes information on the variation of the filter coefficients, to the first communication device 1. Thereafter, unlike the initially performed operation S40, in operation S40, the first communication device 1 may refresh the lookup table LUT based on the information on the variation of the filter coefficients. An example of operation S40 of refreshing the lookup table LUT in response to channel information including information on the variation of the filter coefficients will be described with reference to FIG. 12.

Figure 11:
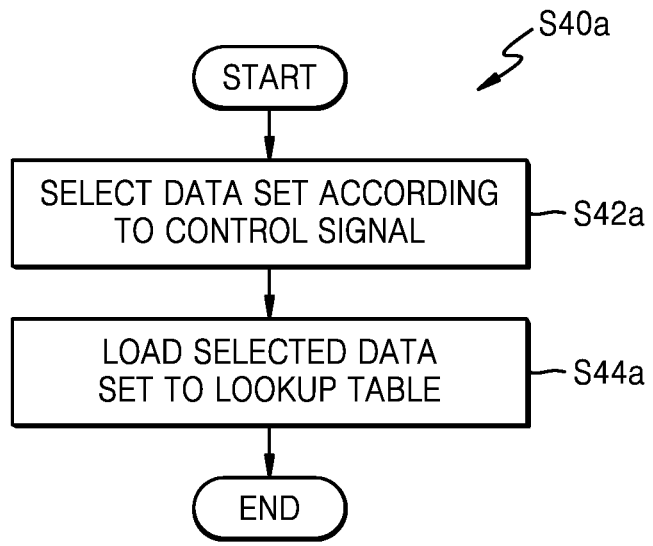
FIG. 11 is a flowchart illustrating an example of operation S40 of FIG. 10 according to an exemplary embodiment of the disclosure.
Figure 12:
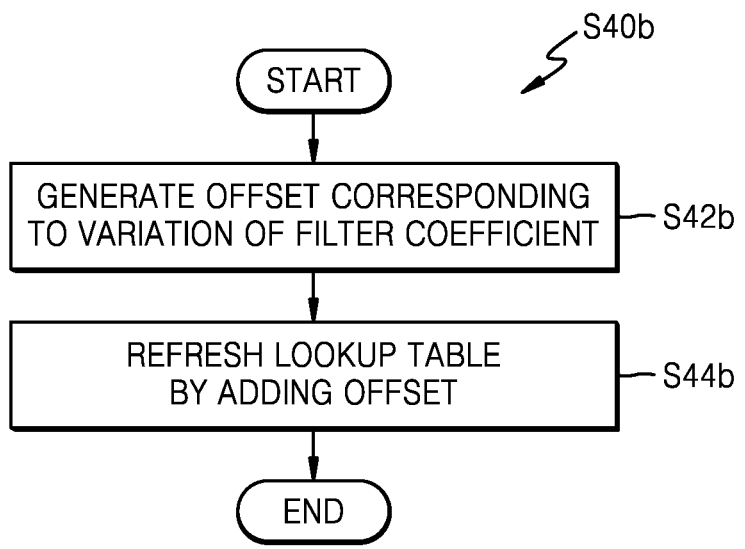
FIG. 12 is a flowchart illustrating another example of operation S40 of FIG. 10 according to an exemplary embodiment of the disclosure.
Figure 13:
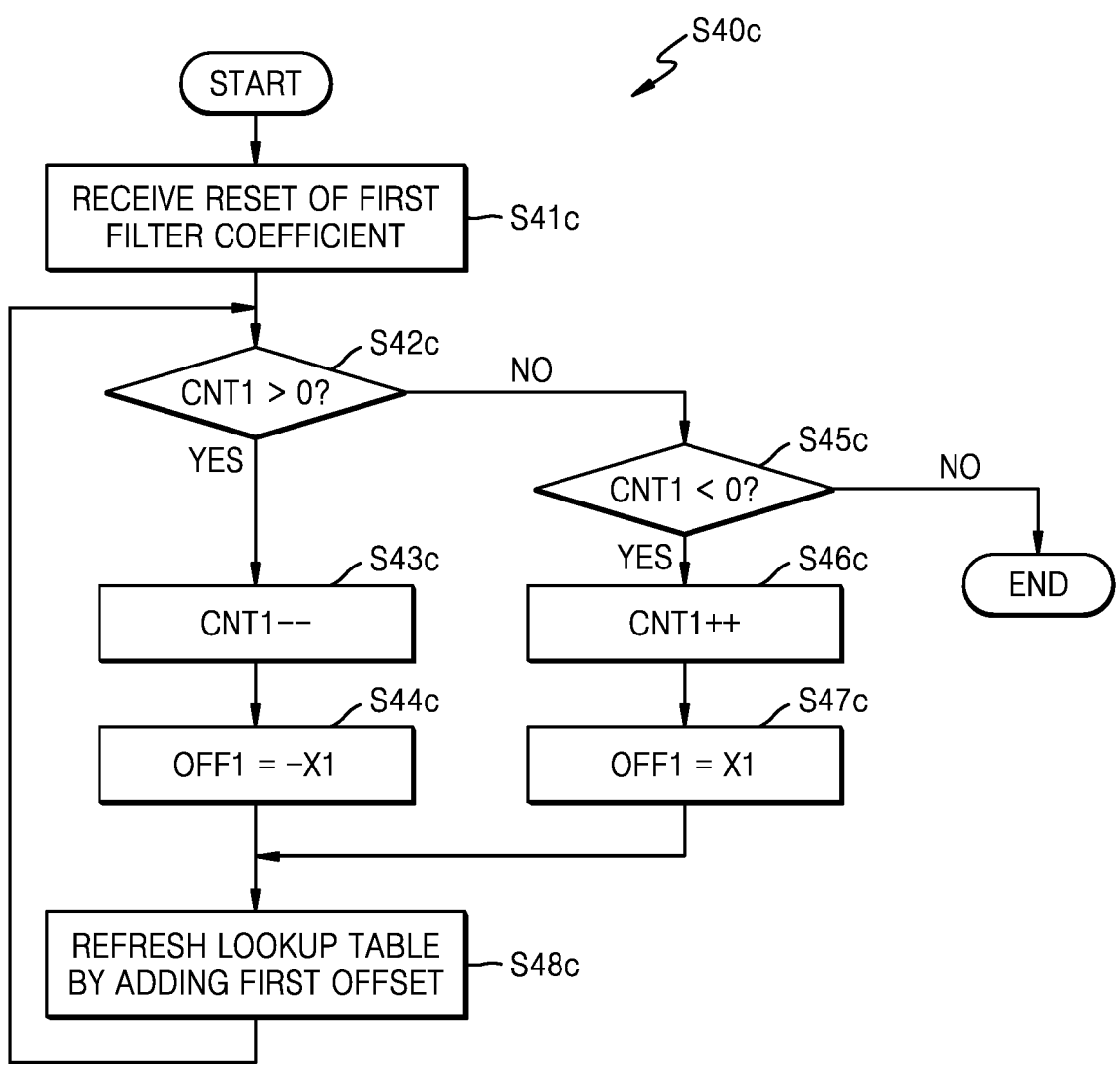
FIG. 13 is a flowchart illustrating still another example of operation S40 of FIG. 10 according to an exemplary embodiment of the disclosure.

FIGS. 11-13 are flowcharts illustrating examples of operation S40 of FIG. 10 according to exemplary embodiments of the disclosure. As described above with reference to FIG. 10, the operation of refreshing the lookup table LUT may be performed in operations S40a, S40b, and S40c of FIGS. 11 to 13. For example, operation S40a of FIG. 11 may be performed by the filter block 100 of FIG. 3, and operation S40b of FIG. 12 and operation S40c of FIG. 13 may be performed by the filter block 100' of FIG. 6. Hereinafter, FIGS. 11 to 13 will be described with reference to FIGS. 3 and 6, respectively.

Referring to FIG. 11, operation S40a may include operations S42a and S44a. In operation S42a, an operation of selecting a data set according to the control signal CTRL may be performed. For example, the controller 110 of FIG. 3 may receive a control signal CTRL including information indicating one of k filter coefficient sequences and may control the data storage 120 to output one of first to k-th data sets SET1 to SETk, which are stored in the data storage 120, according to the control signal CTRL.

In operation S44a, an operation of loading the selected data set into the lookup table 130 may be performed. For example, the controller 110 may control the data storage 120 and the lookup table 130 to store the second value VAL2 outputted from the data storage 120 in the lookup table 130.

Referring to FIG. 12, operation S40b may include operations S42b and S44b. In operation S42b, an operation of generating an offset OFF corresponding to the variation of the filter coefficients may be performed. For example, the offset generator 150 of FIG. 6 may generate an offset OFF, based on the variation signal VAR and the index IDX provided from the controller 110'. The variation signal VAR may indicate at least one of up, down, hold, and reset of the filter coefficient and may include a variation amount of the filter coefficient. An example of generating the offset OFF when the variation signal VAR indicates the reset of the filter coefficient will be described later with reference to FIG. 13.

In operation S44b, an operation of refreshing the lookup table 130' may be performed by adding the offset OFF. In some embodiments, the offset generator 150 may generate a positive offset OFF or a negative offset OFF, and thus the calculator 160 may perform an addition. In some embodiments, the offset generator 150 may generate the positive offset OFF, and thus the calculator 160 may perform addition or subtraction according to the control of the controller 110'. The lookup table 130' may be refreshed by storing the output value of the calculator 160, that is, the third value VAL3, in the lookup table 130'.

Referring to FIG. 13, an operation of resetting the filter coefficient may be performed in operation S40c, and specifically, operation S40c shows an example of an operation of resetting the first filter coefficient C1 using the first offset generator 151 of FIG. 7. As shown in FIG. 13, operation S40c may include operations S41c to S48c. It will be understood that the second, third, and fourth filter coefficients C2, C3, and C4 may also be reset similarly to that shown in FIG. 13.

In operation S41c, an operation of receiving a reset of the first filter coefficient C1 may be performed. In some embodiments, each of the four filter coefficients C1, C2, C3, and C4 may be reset independently of one another, and the reset filter coefficients may have the initial values, i.e., values which have not increased or decreased the filter coefficients. For example, when the reset of the first filter coefficient C1 is received, the second, third, and fourth filter coefficients C2, C3, and C4 may remain in an increased or decreased state, and only the first filter coefficient C1 may be reset. The values stored in the data storage 120' of FIG. 6 correspond to a case where all four filter coefficients C1, C2, C3, and C4 have initial values, and thus when only part of the four filter coefficients C1, C2, C3, and C4 are reset, loading the values stored in the data storage 120' into the lookup table 130' may cause an error.

In operations S42c to S48c, an operation of refreshing the lookup table 130' may be performed until offsets generated by the increase or decrease of the first filter coefficient C1 are offset. To this end, the first offset generator 151 may track the variation of the first filter coefficient C1 and may include a counter 151_2 which outputs a count value CNT1 corresponding to a difference between the number of times of adding the step size to the first filter coefficient C1 and the number of times of subtracting the step size from the first filter coefficient C1, as described above with reference to FIG. 7.

In operation S42c, an operation of determining whether the count value CNT1 is a positive number may be performed. If the count value CNT1 is a positive number, operation S43c is performed subsequently, but if the count value CNT1 is not a positive number, operation S45c may be performed subsequently. Further, in operation S45c, an operation of determining whether the count value CNT1 is a negative number may be performed. If the count value CNT1 is a negative number, operation S46c is performed subsequently, but if the count value CNT1 is not a negative number, that is, if the count value CNT1 is zero, operation S40c may be terminated.

When the count value CNT1 is a positive number, the count value CNT1 may be decreased by 1 in operation S43c, and the first offset OFF1 may have a value opposite to that of the step size X1 in operation S44c. That is, the first offset OFF1 may have a negative value in order to reduce the value included in the lookup table 130'. On the other hand, when the count value CNT1 is a negative number, the count value CNT1 may be increased by 1 in operation S46c, and the first offset OFF1 may coincide with the step size X1 in operation S47c.

In operation S48c, an operation of refreshing the lookup table 130' may be performed by adding the first offset OFF1. The value contained in the lookup table 130' may be reduced by a first offset OFF1 if it has a positive offset according to the variation of the first filter coefficient C1, but if it has a negative offset according to the variation of the first filter coefficient C1, the value may be increased by the first offset OFF1. Then, operation S42c may be performed subsequently, and as a result, the operation of refreshing the lookup table 130' may be repeated until the count value CNT1 becomes zero.

Figure 14:
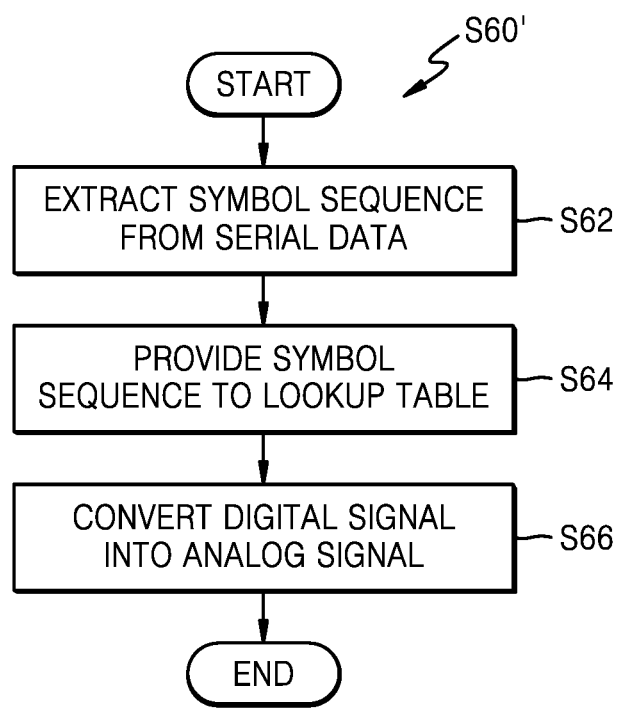
FIG. 14 is a flowchart illustrating an example of operation S60 of FIG. 10 according to an exemplary embodiment of the disclosure.

FIG. 14 is a flowchart illustrating an example of operation S60 of FIG. 10 according to an exemplary embodiment of the disclosure. As described above with reference to FIG. 10, the operation of equalizing serial data SER may be performed in operation S60' of FIG. 14, and operation S60' may include a plurality of operations S62, S64 and S66, as illustrated in FIG. 14. For example, operation S60' may be performed by the TX equalizer 12' of FIG. 3, and FIG. 14 will be described with reference to FIG. 3.

In operation S62, an operation of extracting the symbol sequence SEQ from the serial data SER may be performed.

For example, the shift register 140 may sequentially extract four consecutive symbol sequences SEQ from the serial data SER. In operation S64, an operation of providing the symbol sequence SEQ to the lookup table 130 may be performed. For example, the shift register 140 may provide the symbol sequence SEQ to the lookup table 130, and the lookup table 130 may output a digital signal DSIG having a value corresponding to the received symbol sequence SEQ. Thereafter, in operation S66, an operation of converting a digital signal DSIG into an analog signal may be performed. For example, the DAC 200 may receive the digital signal DSIG from the lookup table 130 and may generate a TX signal TXS, which is an analog signal, by converting the digital signal DSIG.

Figure 15:
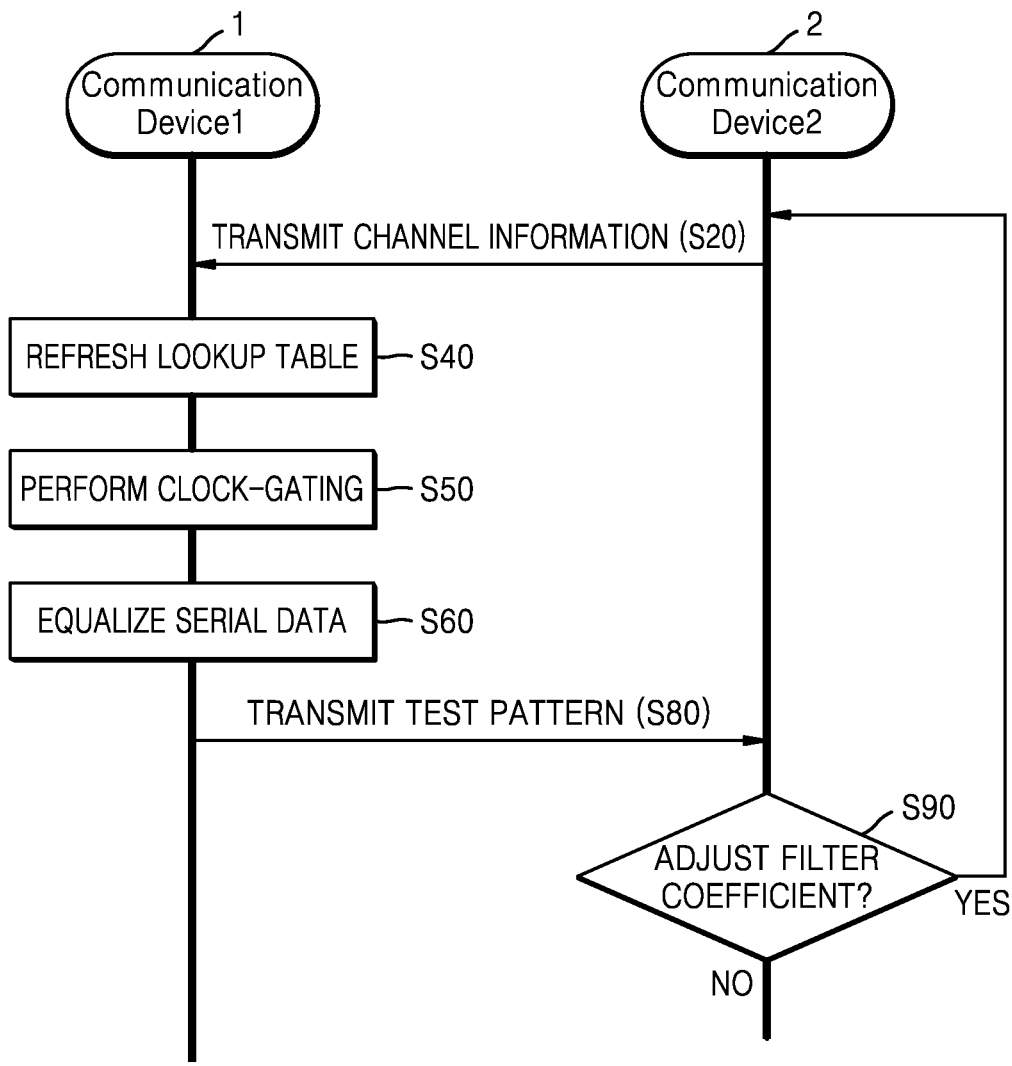
FIG. 15 is a diagram illustrating an equalization method over time according to an exemplary embodiment of the disclosure.

FIG. 15 is a diagram illustrating an equalization method over time according to an exemplary embodiment of the disclosure. Specifically, compared to the equalization method of FIG. 10, the equalization method of FIG. 15 may further include operation S50. For example, the equalization method of FIG. 15 may be performed by the first communication device 1 including the TX equalizer 12' of FIG. 3 and the second communication device 2 communicating with the first communication device 1. In the following description about FIG. 15, the description already given with reference to FIG. 10 will be omitted. It is assumed that the first communication device 1 of FIG. 15 includes the TX equalizer 12' of FIG. 3, and FIG. 15 will be described with reference to FIG. 3.

The second communication device 2 may transmit channel information in operation S20 and the first communication device 1 may refresh the lookup table 130 in operation S40. Thereafter, in operation S50, the first communication device 1 may perform clock gating. For example, after the operation of refreshing the lookup table 130 is terminated in operation S40, the controller 110 may stop supplying the clock signals supplied to the elements necessary for refreshing the lookup table 130. For example, in the example of FIG. 3, the controller 110 may stop supplying clock signals to the data storage 120, and in the example of FIG. 6, the controller 110' may stop supplying clock signals to at least one of the generator 150 and the calculator 160. As such, unnecessary power consumption may be eliminated during equalization of the serial data SER in operation S60. Thereafter, subsequent operations S60, S80, and S90 may be performed, and if it is determined in operation S90 that adjustment of the filter coefficients is necessary, operation S20 may be performed and then, in operation S40, the supply of the clock signals to the components necessary for refreshing the lookup table 130 may be resumed.

Figure 16:
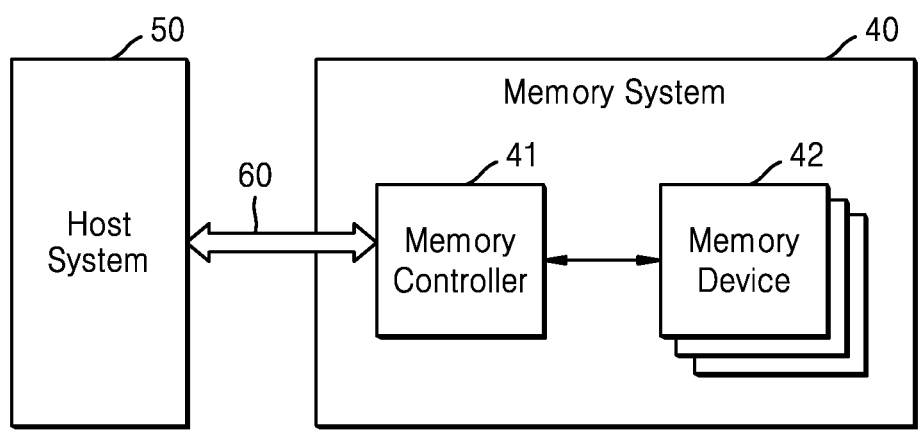
FIG. 16 is a block diagram illustrating systems including FIR filters according to an exemplary embodiment of the disclosure.

FIG. 16 is a block diagram illustrating systems including FIR filters according to an exemplary embodiment of the disclosure. As illustrated in FIG. 16, a memory system 40 and a host system 50 may communicate via an interface 60, and the memory system 40 may include a memory controller 41 and a memory device 42.

The interface 60 may utilize electrical signals and/or optical signals and may include a serial advanced technology attachment (SATA) interface, a SATAe (SATA express) interface, a serial attached small computer system interface (SCSI), a Universal Serial Bus (USB) interface, or a combination thereof, but the disclosure is not limited to these examples. The host system 50 and the memory controller 41 may include SerDes for serial communication, and SerDes may include an equalizer including an FIR filter according to an exemplary embodiment of the disclosure.

In some embodiments, the memory system 40 may communicate with the host system 50 by being removably coupled to the host system 50. The memory device 42 may be a non-volatile memory, and the memory system 40 may be referred to as a storage system. For example, the memory system 40 may be implemented by solid-state or solid-state disk (SSD), an embedded SSD (eSSD), a multimedia card (MMC), or an embedded multimedia card (eMMC), but the disclosure is not limited to these examples. The memory controller 41 may control the memory device 42 in response to a request received from the host system 50 via the interface 60.

Figure 17:
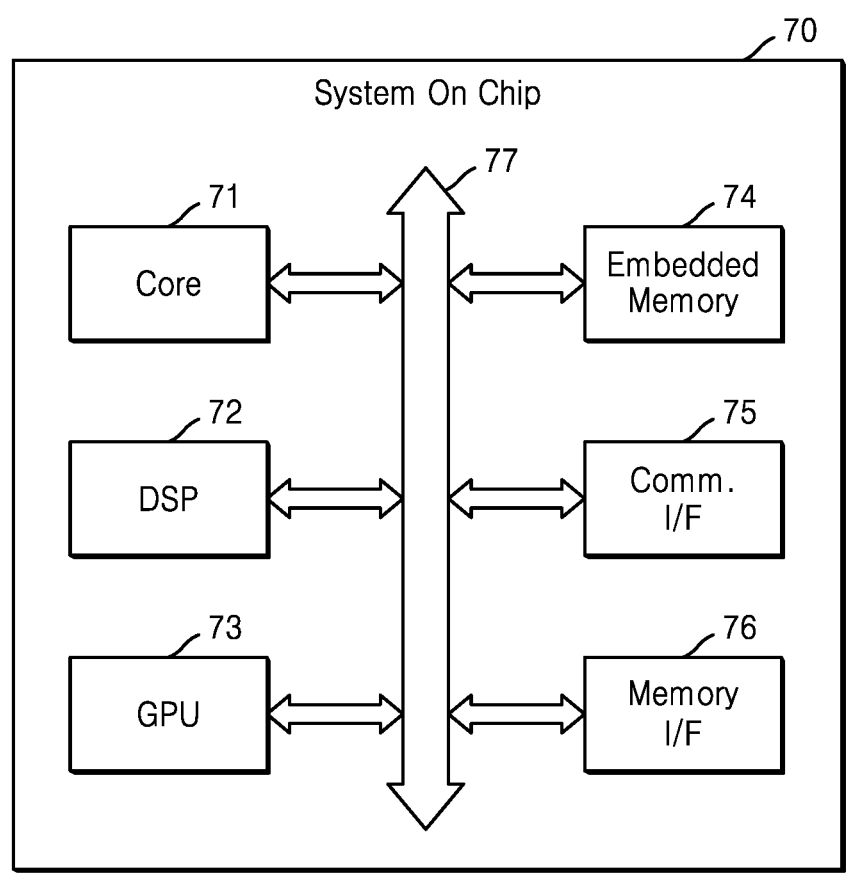
FIG. 17 is a block diagram illustrating a system-on-chip including a memory device according to an exemplary embodiment of the disclosure.

FIG. 17 is a block diagram illustrating a system-on-chip (SoC) 70 including a memory device according to an exemplary embodiment of the disclosure. The SoC 70 may refer to an integrated circuit that is generated by integrating components of a computing system or other electronic systems. As an example of the SoC 70, an application processor (AP) may include components for the processor and other functions. As illustrated in FIG. 17, the SoC 70 includes a core 71, a digital signal processor (DSP) 72, a graphics processing unit (GPU) 73, an internal memory 74, a communication interface 75, and a memory interface 76. The components of the SoC 70 may communicate with each other via a bus 77.

The core 71 may process instructions and may control the operation of the components in the SoC 70. For example, the core 71 may operate an operating system by processing a series of instructions and execute applications on the operating system. The DSP 72 may generate useful data by processing digital signals, e.g., digital signals provided from the communication interface 75. The GPU 73 may generate data for an image outputted through the display device from image data provided from the internal memory 74 or the memory interface 76 and may encode the image data. The internal memory 74 may store data which is necessary for the operation of the core 71, the DSP 72, and the GPU 73. The memory interface 76 may provide an interface to the external memory of the SoC 70 such as dynamic random access memory (DRAM), a flash memory, or the like.

The communication interface 75 may provide serial communication with the outside of the SoC 70. For example, the communication interface 75 may be connected to Ethernet and may include SerDes for serial communication. Since the SerDes may include an equalizer including an FIR filter according to an exemplary embodiment of the disclosure, the communication interface 75 may have a simple structure and may also consume reduced power.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been particularly shown and described with reference to embodiments thereof, it will be understood that various changes in form and details may be made therein without departing from the spirit and scope of the following claims.

What is claimed is:

1. An integrated circuit for generating an equalized signal from serial data according to a channel, the integrated circuit comprising:
   a shift register configured to extract a symbol sequence from the serial data;
   a data storage configured to store values of an equalized digital signal corresponding to potential symbol sequences corresponding to a filter coefficient sequence;
   a lookup table configured to output the equalized digital signal of a value corresponding to the symbol sequence;
   a digital-to-analog converter configured to convert the equalized digital signal into the equalized signal; and
   a controller configured to refresh the lookup table, based on at least one of values stored in the data storage and values included in the lookup table, in response to a control signal, wherein:
   the data storage stores values of the equalized digital signal grouped into a plurality of data sets corresponding to a plurality of filter coefficient sequences, and
   the controller is further configured to load one of the plurality of data sets into the lookup table based on the control signal.

2. The integrated circuit of claim 1, further comprising:
   an offset generator configured to provide an offset of the equalized digital signal corresponding to a variation of a filter coefficient; and
   a calculator configured to perform an addition or subtraction on at least two of: (1) the values stored in the data storage, (2) the values included in the lookup table, and (3) the offset, wherein
   the controller is further configured to provide the variation of the filter coefficient to the offset generator based on the control signal and loads an output value of the calculator into the lookup table.

3. The integrated circuit of claim 2, wherein the offset generator comprises a step size table configured to output a step size corresponding to a pair of a filter coefficient and a symbol.

4. The integrated circuit of claim 3, wherein the offset generator comprises:
   a counter configured to generate a count value which is increased, decreased, or maintained according to the variation of the filter coefficient; and
   a multiplier configured to output the offset by selectively changing a sign of the step size according to the variation of the filter coefficient.

5. The integrated circuit of claim 3, wherein the controller is further configured to refresh the step size table based on the control signal.

6. The integrated circuit of claim 3, wherein the offset generator comprises a counter configured to output a count value that increases or decreases according to the variation of the filter coefficient.

7. The integrated circuit of claim 6, wherein the controller is further configured to repeat refreshing of the lookup table until the count value becomes zero if the variation of the filter coefficient corresponds to a reset of the filter coefficient.

8. The integrated circuit of claim 2, wherein the controller is further configured to perform clock gating of at least one of the data storage, the offset generator, and the calculator after refreshing the lookup table.

9. The integrated circuit of claim 1, wherein the data storage is rewritable and configured to store values of the equalized digital signal according to an externally received signal.

10. The integrated circuit of claim 1, wherein the symbol sequence includes 2-bit symbols.

11. A transmitter for transmitting input data through a channel, the transmitter comprising:
    a serializer configured to generate serial data from the input data;
    an equalizer comprising a finite impulse response (FIR) filter block configured to use a lookup table that outputs a digital signal corresponding to a symbol sequence extracted from the serial data, and a digital-to-analog converter configured to output an equalized signal by converting the digital signal; and
    a driver configured to amplify the equalized signal, wherein:
    the FIR filter block configured to refresh the lookup table based on channel information received through the channel, and
    the FIR filter block is further configured to refresh the lookup table by adding an offset of the digital signal corresponding to a variation of a filter coefficient.

12. The transmitter of claim 11, wherein the FIR filter block further comprises a data storage for storing values of the digital signal corresponding to potential symbol sequences and is further configured to refresh the lookup table based on at least one of the values stored in the data storage and values included in the lookup table.

13. The transmitter of claim 12, wherein:
    the data storage stores values of the digital signal grouped into a plurality of data sets corresponding to a plurality of filter coefficient sequences, and
    the FIR filter block refreshes the lookup table by loading one of the plurality of data sets.

14. The transmitter of claim 11, wherein the FIR filter block is configured to adjust previously-applied offsets if the variation of the filter coefficient corresponds to a reset of the filter coefficient.

15. A method for transmitting serial data through a channel, the method comprising:
    receiving a control signal generated based on channel information received through the channel;
    refreshing a lookup table configured to output an equalized digital signal from a symbol sequence in response to a control signal;
    extracting a symbol sequence from the serial data;
    providing the symbol sequence to the lookup table; and
    converting the equalized digital signal outputted from the lookup table into an analog signal, wherein
    the refreshing of the lookup table comprises refreshing the lookup table by adding an offset of the equalized digital signal corresponding to a variation of a filter coefficient.

16. The method of claim 15, wherein the refreshing of the lookup table comprises loading, from a data storage storing values of the equalized digital signal grouped into a plurality of data sets corresponding to a plurality of filter coefficient sequences, one of the plurality of data sets to the lookup table.

17. The method of claim 16, further comprising performing clock gating of the data storage after the refreshing of the lookup table is terminated.

\* \* \* \* \*